(12) United States Patent
Halle

(10) Patent No.: US 7,268,082 B2
(45) Date of Patent: Sep. 11, 2007

(54) HIGHLY SELECTIVE NITRIDE ETCHING EMPLOYING SURFACE MEDIATED UNIFORM REACTIVE LAYER FILMS

(75) Inventor: Scott D. Halle, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 134 days.

(21) Appl. No.: 10/835,990

(22) Filed: Apr. 30, 2004

(65) Prior Publication Data
US 2005/0245155 A1    Nov. 3, 2005

(51) Int. Cl.
H01L 21/302 (2006.01)

(52) U.S. Cl. .................. 438/706; 438/724; 438/723; 216/37

(58) Field of Classification Search ............... 438/706, 438/724, 734; 216/37
See application file for complete search history.

(56) References Cited

U.S. PATENT DOCUMENTS

| | | | |
|---|---|---|---|
| 4,174,251 A | 11/1979 | Paschke | |
| 4,529,476 A | 7/1985 | Kawamoto et al. | |
| 4,857,140 A | 8/1989 | Loewenstein | |
| 5,201,994 A | 4/1993 | Nonaka et al. | |
| 5,387,312 A | 2/1995 | Keller et al. | |
| 5,431,772 A | 7/1995 | Babie et al. | |
| 5,437,765 A | 8/1995 | Loesenstein | |
| 5,786,276 A * | 7/1998 | Brooks et al. | 438/724 |
| 5,788,870 A | 8/1998 | Nguyen et al. | |
| 6,060,400 A | 5/2000 | Oehrlein et al. | |
| 6,069,067 A * | 5/2000 | Kinugawa | 438/622 |
| 6,461,529 B1 | 10/2002 | Boyd et al. | |
| 2001/0009798 A1* | 7/2001 | Dickerson et al. | 438/444 |

OTHER PUBLICATIONS http://snf.sanford.edu/equiptment/wbnitride/operation.html, no date.*
Armacost, M., "Plasma-etching processes for ULSI semiconductor circuits," IBM Journal of Research and Development, Jan.-Mar. 1999, 28 pages.

* cited by examiner

Primary Examiner—Duy-Vu N. Deo
Assistant Examiner—Patricia A. George
(74) Attorney, Agent, or Firm—Gibb & Rahman, LLC; Joseph Petrokaitis, Esq.

(57) ABSTRACT

Disclosed is a method of selectively etching nitride in a chemical downstream etching process. The invention begins by placing a wafer having oxide regions and nitride regions in a chamber. Then, the invention performs a chemical downstream etching process using $CH_2F_2$ to etch and convert the nitride regions into surface mediated uniform reactive film (SMURF) regions comprising $(NH_4)_2SiF_6$. This process then rinses the surface of the wafer with water to remove the surface mediated uniform reactive film regions from the wafer, leaving the oxide regions substantially unaffected. The chemical downstream etching process is considered selective because it etches the nitride regions at a higher rate than the oxide regions.

20 Claims, 8 Drawing Sheets

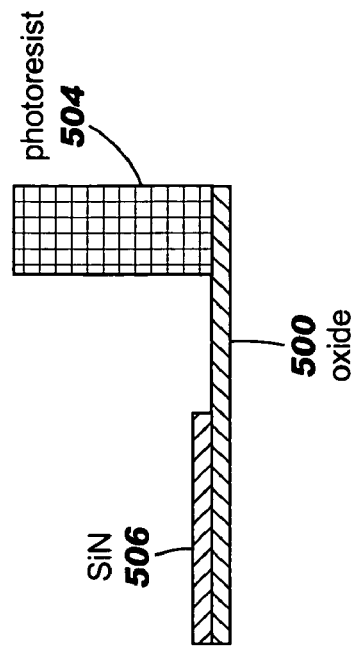
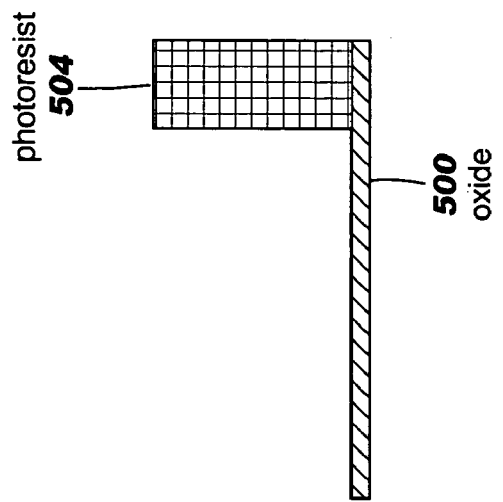
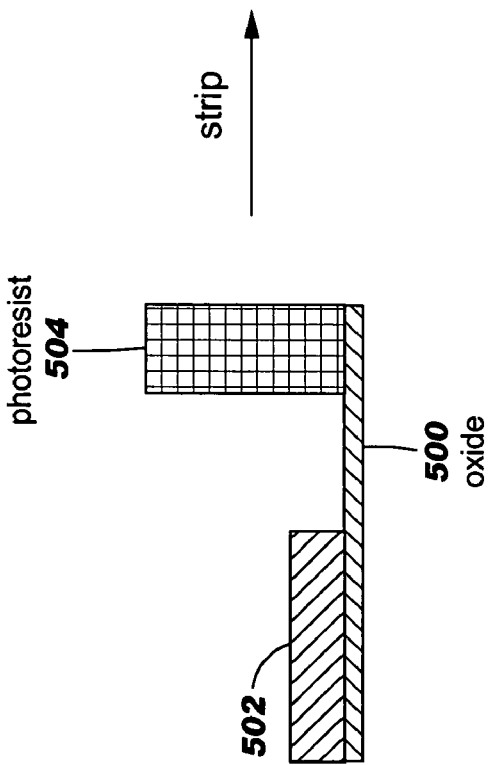

HIGHLY SELECTIVE NITRIDE ETCHING EMPLOYING SURFACE MEDIATED UNIFORM REACTIVE LAYER FILMS

BACKGROUND OF THE INVENTION

1. Field of the Invention

The present invention generally relates to selectively etching nitride in a chemical downstream etching process, and more particularly to an etching process that uses $CH_2F_2$ to etch and convert the nitride regions into surface mediated uniform reactive film (SMURF) regions comprising $(NH_4)_2SiF_6$.

2. Description of the Related Art

The standard process for highly selective isotropic nitride etching is a wet process, e.g., a hot phosphoric acid bath. This process suffers from the following drawbacks. It is difficult to control the etch rate and etch selectively over the life of the bath. This wet etching also has poor cross wafer uniformity (>20% 3σ). Also, the requirement for timed overetching approaches 50% with this process. Further, this etching chemistry is not compatible with resist or polysilicon and there are severe environmental handling and disposal issues with phosphoric acid. The phosphoric acid additionally has contamination issues with Cu, which can have undesired effects on devices.

Alternate dry etch process have been offered which have a severe tradeoff between an acceptable nitride etch rate (>2000 A/min) and nitride/oxide etch selectivity (>50:1). Additionally, the reaction mechanisms are not understood conventionally and general prescriptions of process control have not been offered. The invention described below addresses these concerns.

SUMMARY OF THE INVENTION

Disclosed is a method of selectively etching nitride in a chemical downstream etching process. The invention begins by placing a wafer having oxide regions and nitride regions in a chamber. Then, the invention performs a chemical downstream etching process using $CH_2F_2$ to etch and convert the nitride, (starting from the top of the nitride regions) into surface mediated uniform reactive film (SMURF) regions comprising $(NH_4)_2SiF_6$. As the etching progresses, the remaining nitride film is converted into a surface mediated uniform reactive film (SMURF). This process then rinses the surface of the wafer with water to remove the surface mediated uniform reactive film regions from the wafer, leaving the oxide regions substantially unaffected. The chemical downstream etching process is considered selective because it etches the nitride regions at a substantially higher rate than the oxide regions.

The surface mediated uniform reactive film regions are formed to a minimum thickness of approximately 100 angstroms prior to the rinsing process (which is performed in a separate water rinsing tool) and the chemical downstream etching process is performed at temperatures below 50° C. to maintain at least this minimum thickness. The invention can also add $O_2$, Ar, and/or $N_2$ into the chamber during the chemical downstream etching process to modulate the etch rate. Similarly, the invention increases the concentrations of the $CH_2F_2$ in the chamber and/or introduces $N_2$ into the chamber, during the etching process to increase the etching selectivity of the nitride regions with respect to the oxide regions.

This high selective nitride etching is achieved when the SMURF is formed and present during the $CH_2F_2$ downstream process. High selective nitride etching cannot be achieved when the SMURF is not formed, even if etching is occurring with a $CH_2F_2$ downstream process. When the SMURF forms on the surface of the nitride film, enhanced nitride etching, and therefore ultra etch selectivity to oxide, is enabled.

The present invention enables an effective dry etch alternative that meets and exceeds the following etch selective properties of hot phosphoric acid; oxide etch selectivity 0.70:1, linearly tunable high etch rates >2000 A/min, good cross wafer uniformity <6% (3 s), optical endpoint control, and etch computability and etch compatability to both resist and polysilicon.

These, and other aspects and objects of the present invention will be better appreciated and understood when considered in conjunction with the following description and the accompanying drawings. It should be understood, however, that the following description, while indicating preferred embodiments of the present invention and numerous specific details thereof, is given by way of illustration and not of limitation. Many changes and modifications may be made within the scope of the present invention without departing from the spirit thereof, and the invention includes all such modifications.

BRIEF DESCRIPTION OF THE DRAWINGS

The invention will be better understood from the following detailed description with reference to the drawings, in which:

FIG. 5 is a diagram illustrating a pad nitride stripping and etchback process;

FIG. 6 is a diagram illustrating a pad nitride stripping and etchback process;

FIG. 7 is a diagram illustrating a pad nitride stripping and etchback process;

DETAILED DESCRIPTION OF PREFERRED EMBODIMENTS OF THE INVENTION

Figure 1:
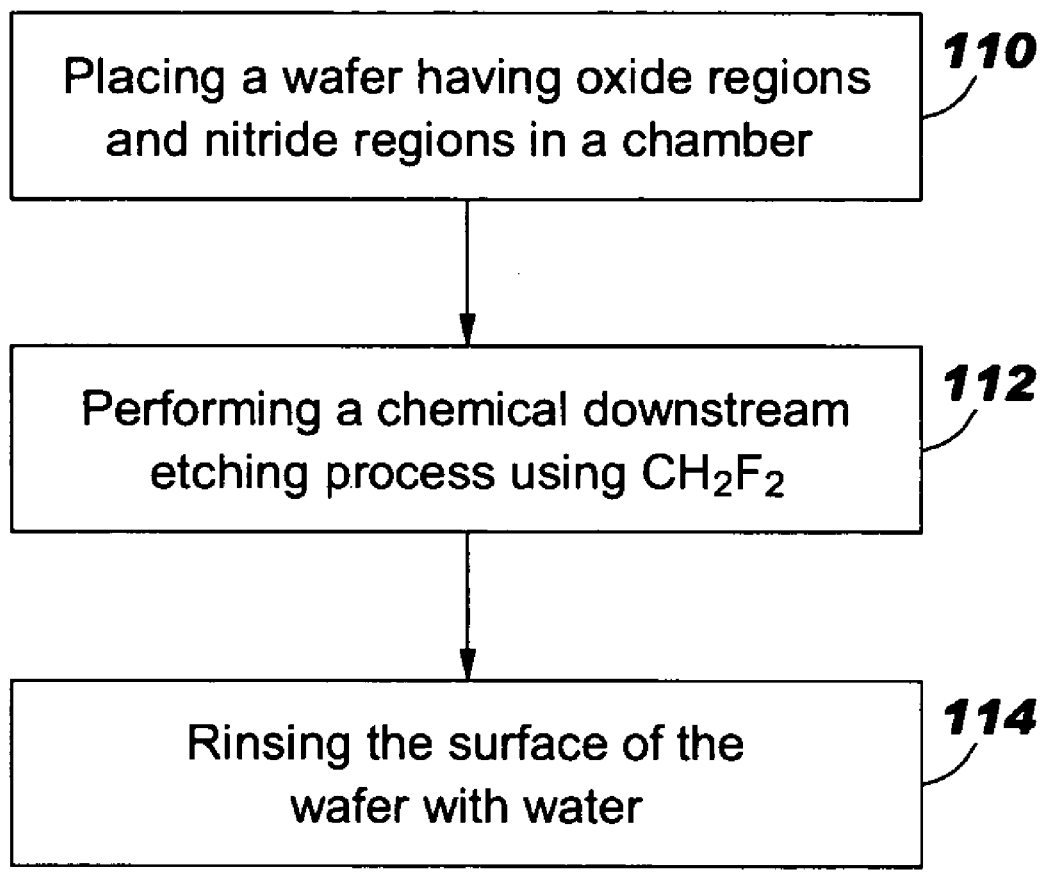
FIG. 1 is a flow diagram illustrating a preferred method of the invention.

The present invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the present invention. The examples used herein are intended merely to facilitate an understanding of ways in which the invention may be practiced and to further enable those of skill in the art to practice the invention. Accordingly, the examples should not be construed as limiting the scope of the invention.

The invention selectively etches nitride (such as a pad nitride, nitride spacer, nitride liner, etc.) in a chemical downstream etching process. As shown in the flowchart in FIG. 1, the invention begins by placing a wafer having oxide regions and nitride regions in a chamber 110. Then, the invention performs a chemical downstream etching process using $CH_2F_2$ 112 to etch nitride. When the nitride regions are converted into surface mediated uniform reactive film (SMURF) regions comprising $(NH_4)_2SiF_6$, nitride etching occurs. The invention then rinses the surface of the wafer with water 114 to remove the surface mediated uniform reactive film regions from the wafer (in a separate chamber), leaving the oxide regions substantially unaffected. The chemical downstream etching process is considered to be selective because it etches the nitride regions at a substantially higher rate than the oxide regions.

The present invention enables an effective dry etch alternative that meets and exceeds the following etch selective properties of hot phosphoric acid; oxide etch selectivity 70:1, linearly tunable high etch rates >2000 A/min, good cross wafer uniformity <6% (3 s), optical endpoint control, and etch compatability and etch selectivity to both resist and polysilicon.

In the present invention, the surface mediated uniform reactive film regions are formed on the etching substrate (i.e., Nitride) and not the exposed selective substrate (i.e., Oxide). The invention is useful with a nitride strip where the underlying oxide beneath the etched/stripped nitride layer does not etch.

The formation of a SMURF layer is unlike standard reactive ion etching where etching of the substrate occurs while simultaneously selectively depositing a polymer layer on the selective substrate to protect the selective substrate and enable enhanced etch selectivity. With the present invention, no protective mask is formed over the oxide.

The surface mediated uniform reactive film regions are formed to a minimum thickness of approximately 100 angstroms prior to the rinsing process (which is performed in a separate water rinsing tool) and the chemical downstream etching process is performed at temperatures below 50° C. to maintain at least this minimum thickness. The invention can also add $O_2$, Ar, and/or $N_2$ into the chamber during the chemical downstream etching process to modulate the etch rate. Similarly, the invention increases the concentrations of the $CH_2F_2$ in the chamber and/or introduces $N_2$ into the chamber, during the etching process to increase the etching selectivity of the nitride regions with respect to the oxide regions.

Figure 2:
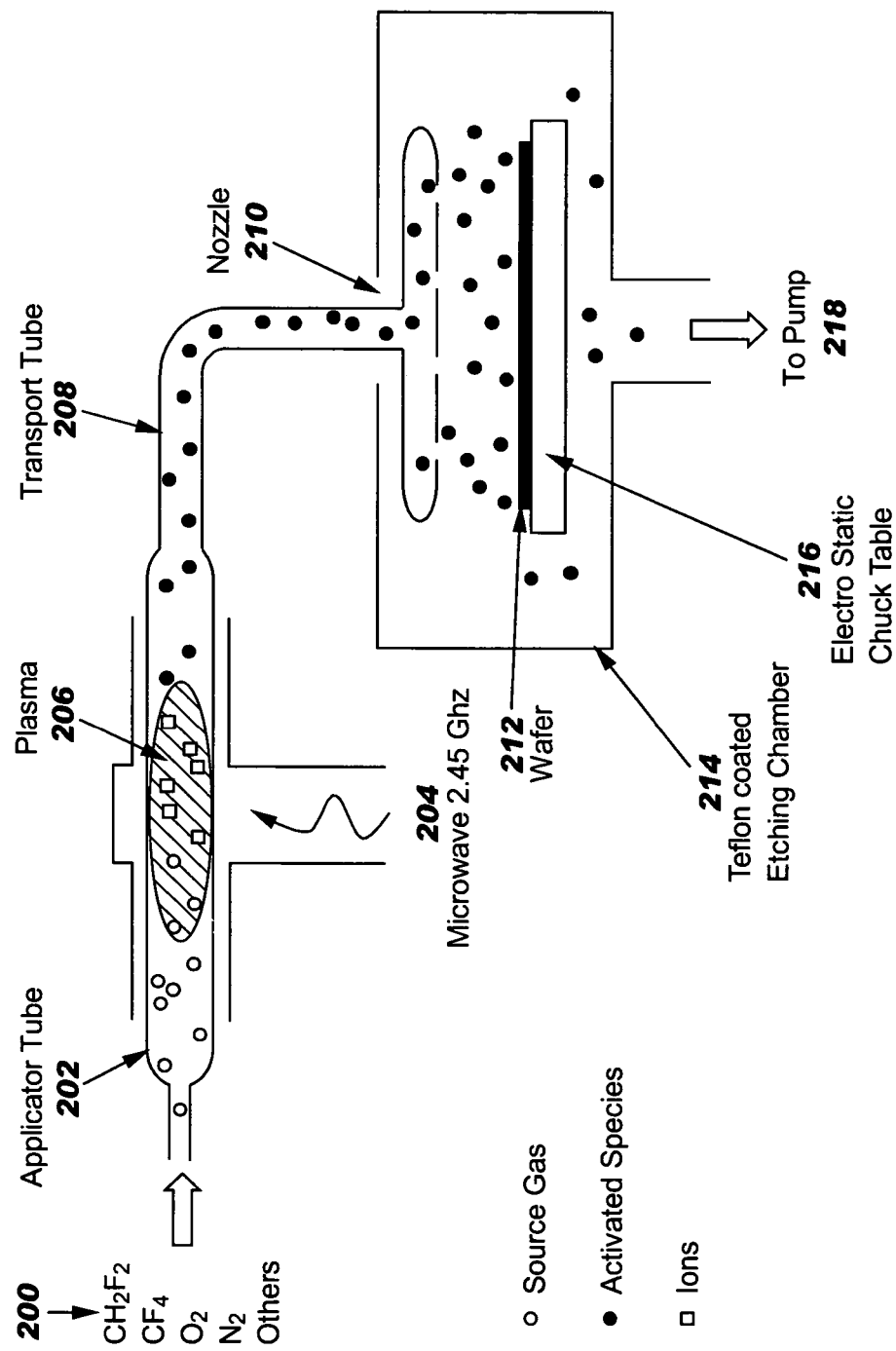
FIG. 2 is a schematic diagram of a chemical downstream etching apparatus according to the invention.

FIG. 2 is a schematic diagram of a chemical downstream etching apparatus in which the $CH_2F_2$ is applied along with one or more other chemicals including $CF_4$, $N_2$, $O_2$, and other similar processing chemicals to the applicator tube 202. A microwave generator 204 ionizes the material to create a plasma 206. The action of a pump 218 draws the ionized plasma free radicals along a transport tube 208 down to a nozzle 210. Long-lived neutral free-radicals are then available to etch and chemically react with the wafer substrate 212 that is within the etching chamber 214. More specifically, the wafer 212 is held by an electrostatic chuck 216. As mentioned above, this etches the nitride films when the nitride regions are converted into surface mediated uniform reactive film (SMURF) regions comprising $(NH_4)_2SiF_6$. The chemical downstream etching process is considered selective because it etches the nitride regions at a higher rate than the oxide regions.

Figure 3B:
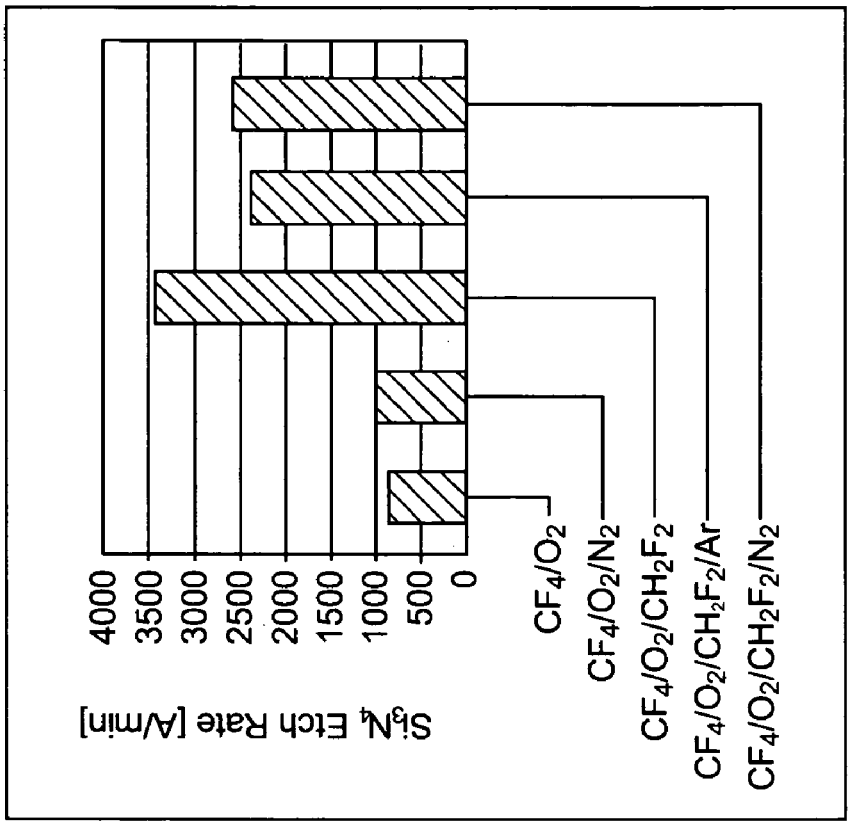
FIGS. 3A and 3B are graphs illustrating the improved etch selectivity and etch rate achieved with the invention.
Figure 3A:
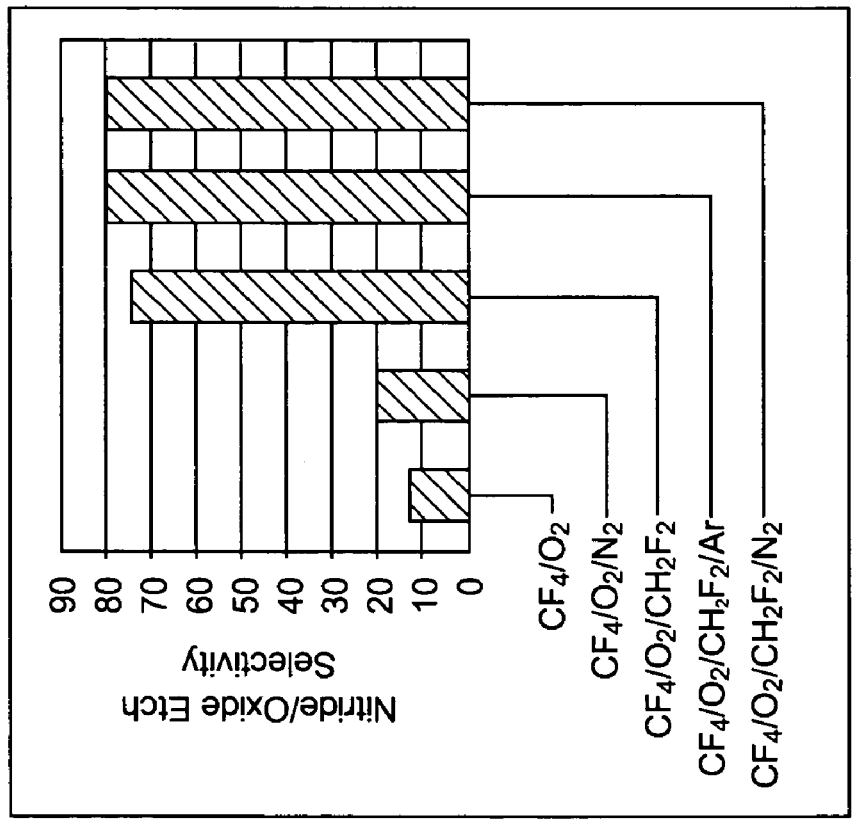

FIGS. 3A and 3B illustrate the increase in both etch selectivity and etch rate that is achieved by forming surface mediated uniform reactive film with the introduction of $CH_2F_2$ under certain process conditions into the chemical downstream etching process. For example, the first two etching processes shown to the left in FIG. 3A do not utilize $CH_2F_2$; however, the last three utilize $CH_2F_2$ and produce substantially improved etch selectivity. Similarly, the first two etching processes shown to the left in FIG. 3B also do not utilize $CH_2F_2$; however, the last three utilize $CH_2F_2$ which dramatically increases the etch rate. Therefore, the inventive use of $CH_2F_2$ in the chemical downstream etching process produces substantial improvements in both etch selectivity and in etch rate.

Some general prescriptions relating to the requirements for the formation of the surface mediated uniform reactive film and hence the enhancement of the nitride etching selectivity have been observed by the inventors. For example, the higher the $N_xH_y$, and F content of a gas supplied to the applicator tube 202 correlates to a higher silicon nitride etch rate and improved etch selectivity. Similarly, a lower gas phase $Si_xO_y$ content results in higher etch selectivity. To the contrary, a higher SiF concentration correlates to a lower silicon nitride etch rate and thus a lower etch selectivity. Increased concentrations of buffer gases such as $O_2$ decreases both silicon nitride and silicon oxide etch rates thereby lowering the overall etch rate without affecting the etch selectivity. Also, $N_2$ is strongly associated with the formation of the $(NH_4)_2SiF_6$ regions and with a larger etch rate.

Figure 4:
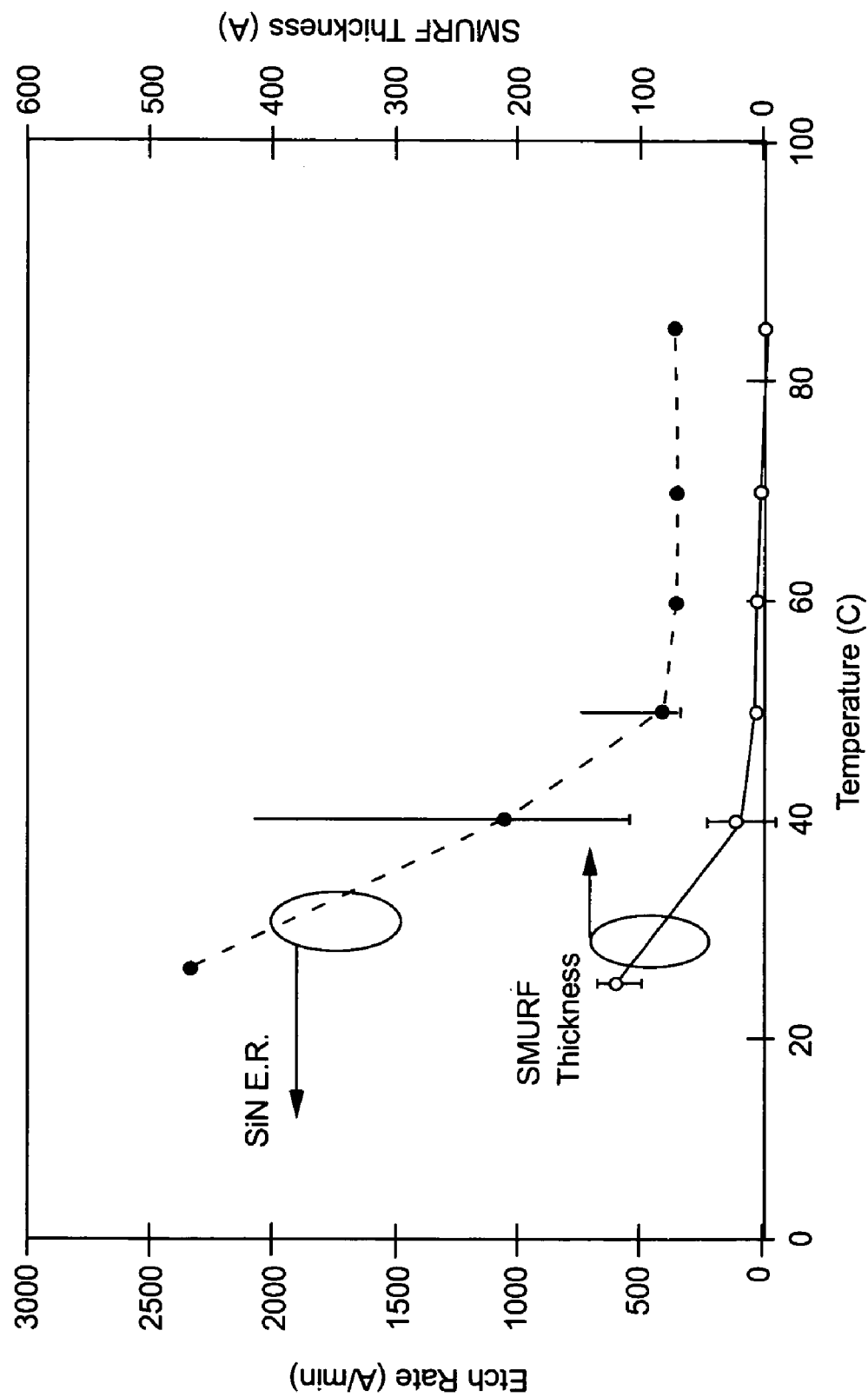
FIG. 4 is a graph illustrating the effects of temperature on film thickness and etch rate.

Further, there is a strongly non-Arrehenius temperature behavior for the formation of the $(NH_4)_2SiF_6$. More specifically, the thickness of the $(NH_4)_2SiF_6$ layer directly correlates with temperature and the nitride etching rate and requires a temperature below 50° C. to form on the wafer surface. Below this temperature threshold, the formation of the SMURF layer, the nitride etching rate and the oxide etching selectivity directly increases with lower temperatures. This is shown, for example, in FIG. 4 where the $(NH_4)_2SiF_6$ thickness drops to zero at approximately 50° C. and the etch selectivity decreases dramatically between approximately 30° C. and 50° C.

FIGS. 5-13 illustrate various applications of the invention. More specifically, FIGS. 5-7 illustrate a pad nitride stripping and etchback process. In FIG. 5, item 500 represents an oxide, item 502 illustrates a nitride layer that has been converted into a SMURF, and item 504 illustrates a photoresist. The SMURF 502 is rinsed, to produce the structure shown in FIG. 6. Next, an additional SiN layer 506 is formed on the oxide 500 in an etchback process.

Figure 9:
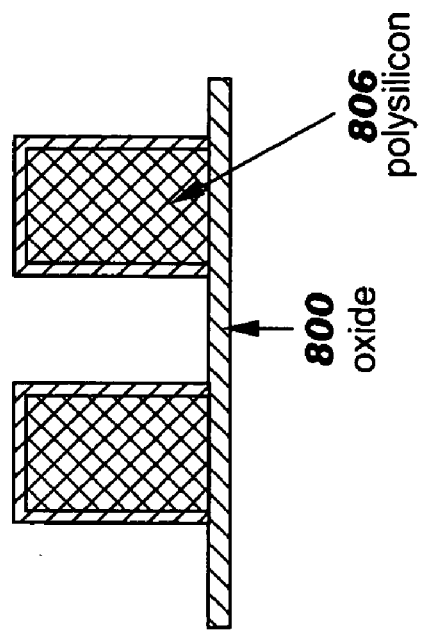
FIG. 9 is a diagram illustrating a nitride spacer removal process.
Figure 8:
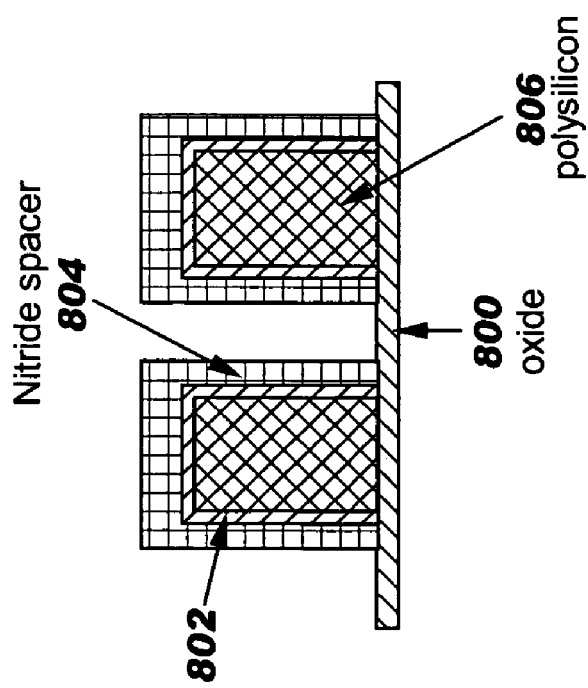
FIG. 8 is a diagram illustrating a nitride spacer removal process.

FIGS. 8 and 9 illustrate a nitride spacer removal process. More specifically, FIG. 8 illustrates a polysilicon structure 806 formed on an oxide layer 800 and surrounded by an oxide layer 802. A nitride spacer 804 that is converted into a SMURF surrounds the oxide 802. The nitride spacer SMURF 804 is removed by rinsing as shown in FIG. 9.

Figure 11:
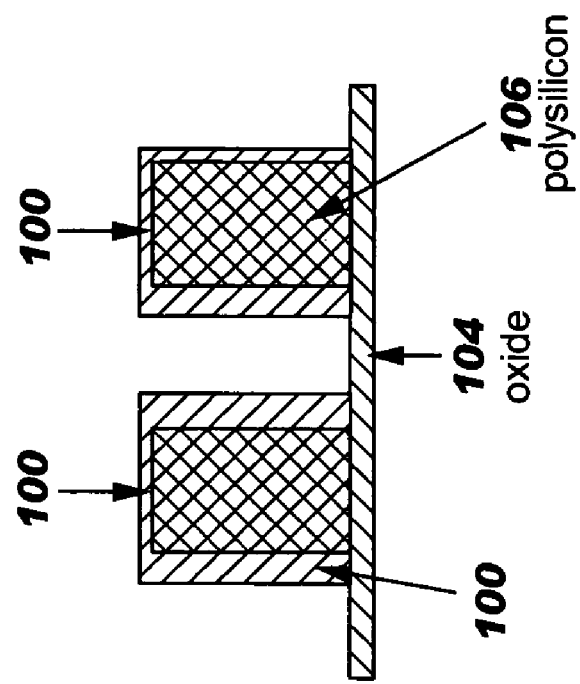
FIG. 11 is a diagram illustrating a nitride liner removal process.
Figure 10:
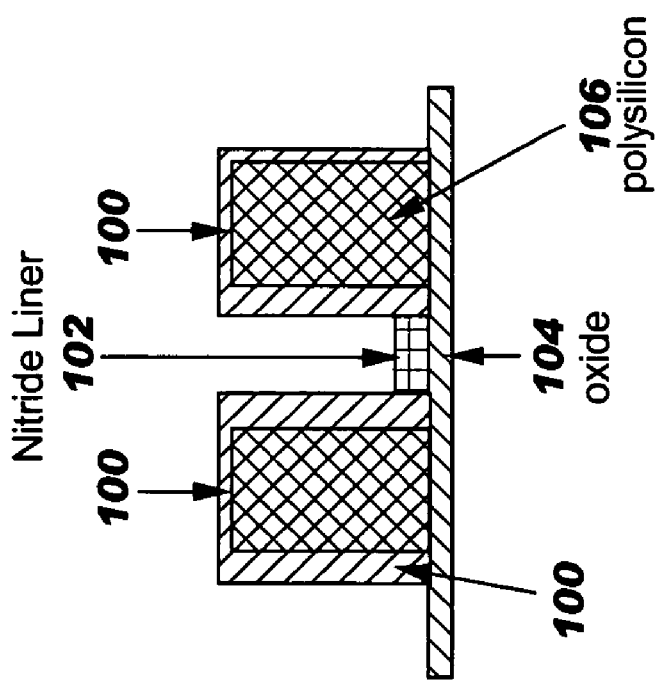
FIG. 10 is a diagram illustrating a nitride liner removal process.
Figure 12:
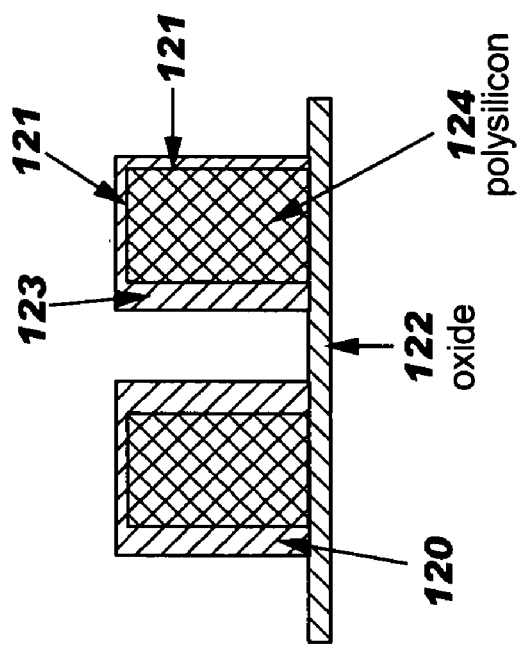
FIG. 12 is a diagram illustrating a different nitride liner removal process.
Figure 13:
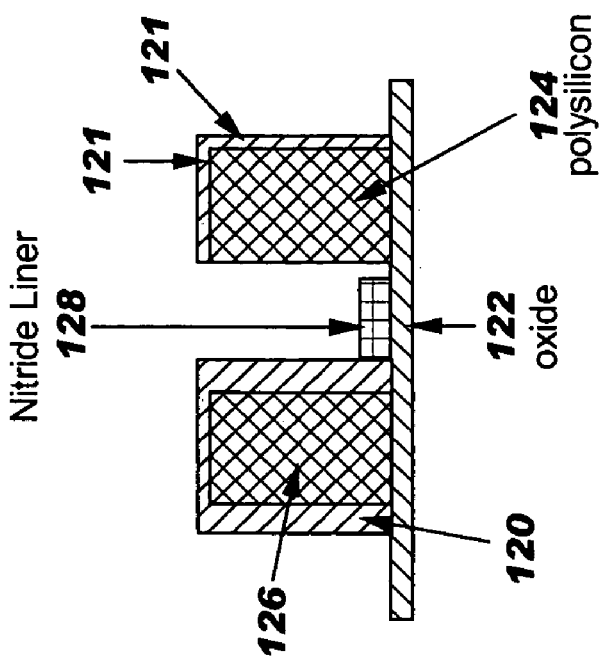
FIG. 13 is a diagram illustrating a different nitride liner removal process.

FIGS. 10 and 11 illustrate a nitride liner removal performed with the invention. In FIG. 10, a polysilicon structure 106 is formed on an oxide 104 and is also surrounded with an oxide 100. Between the polysilicon structures a nitride liner that is converted into a SMURF 102 is present. As shown in FIG. 11, the nitride liner SMURF 102 is removed by rinsing. FIGS. 12 and 13 illustrate a different nitride liner removal process. FIG. 12 illustrates polysilicon structures 124 and 126 formed on the oxide layer 122. The polysilicon structure 126 is surrounded by an oxide 120, while the polysilicon structure 124 has an oxide 121 formed on only two sides. A nitride liner that is converted into a SMURF is shown as item 128. As shown in FIG. 13, the nitride liner 128 is rinsed, and an additional oxide layer 123 is formed on the open side of the polysilicon structure 124.

Therefore, as shown above, the invention provides a substantially improved chemical downstream etching process by introducing $CH_2F_2$ and controlling the temperature below approximately 50° C. This provides substantial increases in etch selectivity between nitrides and oxides, increases overall etch rate, and produces a crystalline residue film $(NH_4)_2SiF_6$ in place of the nitrides which has been described herein as surface mediated uniform reactive film (SMURF) regions, and which is easily removed after the etching process by rinsing with water.

In the examples above, highly oxide selective nitride etching can be demonstrated when processing conditions are consistent with the formation of the SMURF layer. Some advantages of this type of nitride etching within the chemical downstream etching chamber are that a) there is no potential damage of the selective oxide film due to plasma ions b) there is no low level metal impurities, which are commonly found in nitride etching with hot phosphoric acid $(H_3PO_4)$, and which can degrade device performance. In contrast to previous examples of highly selective nitride etching, the etching rate for the processes described here can exceed a very competitive 2000 A/min.

While the invention has been described in terms of preferred embodiments, those skilled in the art will recognize that the invention can be practiced with modification within the spirit and scope of the appended claims.

What is claimed is:

1. A method of selectively and isotropically etching nitride, said method comprising:
    placing a wafer having oxide regions and nitride regions in a chamber;
    performing a chemical downstream etching process,
        wherein said performing of said chemical downstream etching process comprises selectively etching said nitride regions over said oxide regions by using $CH_2F_2$ to convert said nitride regions into surface mediated uniform reactive film regions comprising a crystalline residue film, and
        wherein said performing of said chemical downstream etching process further comprises reducing an etch rate of said nitride regions, by introducing at least one of Ar and $N_2$ into said chamber, to ensure formation of a predetermined minimum thickness of said surface mediated uniform reactive film regions in order to enhance a nitride/oxide etch selectivity; and
    rinsing said surface mediated uniform reactive film regions from said wafer.

2. The method in claim 1, wherein said surface mediated uniform reactive film regions comprise $(NH_4)_2SiF_6$.

3. The method in claim 1, wherein said rinsing process comprises rinsing said wafer with water.

4. The method in claim 1, wherein said etching process is performed at temperatures below 50° C.

5. The method in claim 1, wherein said performing of said chemical downstream etching process further comprises introducing $CF_4O_2$, and said at least one of said Ar and said $N_2$ into said chamber during said chemical downstream etching process so as to simultaneously tune said nitride/oxide etch selectivity to a first etch selectivity ratio and said etch rate of said nitride regions to a first nitride etch rate, wherein said first etch selectivity ratio is greater than a second etch selectivity ratio that is achievable when said $CH_4$ and said $O_2$ are introduced into said chamber with said $CH_2F_2$ and without said Ar or said $N_2$ and wherein said first nitride etch rate is greater than approximately 2000 A/min, but less than a second nitride etch rate that is achievable when said $CH_4$ and said $O_2$ are introduced into said chamber with said $CH_2F_2$ and without said Ar or said $N_2$.

6. The method in claim 1, further comprising during said performing of said chemical downstream etching process at least one of:
    increasing concentrations of said $CH_2F_2$ in said chamber so as to increase said nitride/oxide etch selectivity during said performing of said chemical downstream etching process; and
    introducing $N_2$ into said chamber so as to increase nitride/oxide etch selectivity during said performing of said chemical downstream etching process.

7. The method in claim 1, further comprising modulating said etch rate of said nitride regions during said performing of said chemical downstream etching process by adding at least one of $O_2$, Ar and $N_2$ into said chamber.

8. A method of selectively and isotropically etching nitride in a chemical downstream etching process, said method comprising:
    placing a wafer having oxide regions and nitride regions in a chamber;
    performing a chemical downstream etching process,
        wherein said performing of said chemical downstream etching process comprises selectively etching said nitride regions over said oxide regions by using $CH_2F_2$ in said chamber to convert said nitride regions into surface mediated uniform reactive film regions comprising $(NH_4)_2SiF_6$, and
        wherein said performing of said chemical downstream etching process further comprises reducing an etch rate of said nitride regions, by introducing at least one of Ar and $N_2$ into said chamber, to ensure that said surface mediated uniform reactive film regions are formed with a minimum thickness of approximately 100 angstroms in order to enhance a nitride/oxide etch selectivity; and
    rinsing said surface mediated uniform reactive film regions from said wafer.

9. The method in claim 8, wherein by forming said surface mediated uniform reactive film regions to said minimum thickness of approximately 100 angstroms prior to said rinsing process said nitride/oxide etch selectivity is increased relative to other chemical downstream etch processes which use said $CH_2F_2$, but which do not form said surface mediated uniform reactive film regions with said minimum thickness.

10. The method in claim 8, wherein said rinsing process comprises rinsing said wafer with water.

11. The method in claim 8, wherein said chemical downstream etching process is performed at temperatures below 50° C.

12. The method in claim 8, wherein said performing of said chemical downstream etching process further comprises introducing $CF_4$, $O_2$, and said at least one of said Ar and said $N_2$ into said chamber during said chemical downstream etching process so as to simultaneously tune said nitride/oxide etch selectivity to a first etch selectivity ratio and said etch rate of said nitride regions to a first nitride etch rate, wherein said first etch selectivity ratio is tuned to be greater than a second etch selectivity ratio that is achievable when said $CH_4$ and said $O_2$ are introduced into said chamber with said $CH_2F_2$ and without said Ar or said $N_2$ and wherein said first nitride etch rate is tuned to be greater than approximately 2000 A/min, but less than a second nitride etch rate that is achievable when said $CH_4$ and said $O_2$ are introduced into said chamber with said $CH_2F_2$ and without said Ar or said $N_2$.

13. The method in claim 8, further comprising during said performing of said chemical downstream etching process at least one of:
increasing concentrations of said $CH_2F_2$ in said chamber so as to increase said nitride/oxide etch selectivity during said performing of said chemical downstream etching process; and
introducing $N_2$ into said chamber so as to increase nitride/oxide etch selectivity during said performing of said chemical downstream etching process.

14. The method in claim 8, further comprising modulating said etch rate of said nitride regions during said performing of said chemical downstream etching process by adding at least one of $O_2$, Ar and $N_2$ to said chamber.

15. A method of selectively and isotropically etching nitride in a chemical downstream etching process, said method comprising:
placing a wafer having oxide regions and nitride regions in a chamber;
performing a chemical downstream etching process,
wherein said performing of said chemical downstream etching process comprises selectively etching said nitride regions over said oxide regions by using $CH_2F_2$, $O_2$, $CF_4$ and at least one of Ar and $N_2$ in said chamber in order to simultaneously tune nitride/oxide etch selectivity to a first etch selectivity ratio and an etch rate of said nitride regions to a first nitride etch rate,
wherein said first etch selectivity ratio is greater than a second etch selectivity ratio that is achievable when said $CH_4$ and said $O_2$ are introduced into said chamber with said $CH_2F_2$ and without said Ar or said $N_2$, and
wherein said first nitride etch rate is greater than approximately 2000 A/min, but less than a second nitride etch rate that is achievable when said $CH_4$ and said $O_2$ are introduced into said chamber with said $CH_2F_2$ and without said Ar or said $N_2$, so that said nitride regions are converted into surface mediated uniform reactive film regions comprising $(NH_4)_2SiF_6$ and having a minimum thickness of approximately 100 angstroms; and
rinsing said surface modulated regions from said wafer.

16. The method in claim 15, wherein by forming said surface mediated uniform reactive film regions to said minimum thickness of approximately 100 angstroms prior to said rinsing process said nitride/oxide etch selectivity is increased relative to other chemical downstream etch processes which use said $CH_2F_2$, but do not form said surface mediated uniform reactive film regions with said minimum thickness.

17. The method in claim 15, wherein said rinsing process comprises rinsing said wafer with water.

18. The method in claim 15, wherein said chemical downstream etching process is performed at temperatures below 50° C.

19. The method in claim 15, further comprising introducing one of Ar and $N_2$ into said chamber during said chemical downstream etching process to modulate the etch rate.

20. The method in claim 1, further comprising during said performing of said chemical downstream etching process at least one of:
increasing concentrations of said $CH_2F_2$ in said chamber so as to increase said nitride/oxide etch selectivity during said performing of said chemical downstream etching process;
introducing $N_2$ into said chamber so as to increase nitride/oxide etch selectivity during said performing of said chemical downstream etching process; and
modulating said etch rate of said nitride regions during said performing of said chemical downstream etching process by adding at least one of $O_2$, Ar and $N_2$ to said chamber.

* * * * *